US012598958B2

(12) United States Patent
Ohashi et al.

(10) Patent No.: US 12,598,958 B2
(45) Date of Patent: Apr. 7, 2026

(54) WAFER TREATMENT METHOD

(71) Applicant: NISSAN CHEMICAL CORPORATION, Tokyo (JP)

(72) Inventors: Tomoya Ohashi, Toyama (JP); Suguru Sassa, Toyama (JP); Noriaki Fujitani, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 391 days.

(21) Appl. No.: 18/025,033

(22) PCT Filed: Sep. 6, 2021

(86) PCT No.: PCT/JP2021/032640
§ 371 (c)(1),
(2) Date: Mar. 7, 2023

(87) PCT Pub. No.: WO2022/050405
PCT Pub. Date: Mar. 10, 2022

(65) Prior Publication Data
US 2023/0317527 A1 Oct. 5, 2023

(30) Foreign Application Priority Data
Sep. 7, 2020 (JP) ................................ 2020-149793

(51) Int. Cl.
*H10P 74/20* (2026.01)
*H10P 74/00* (2026.01)
*H10P 90/00* (2026.01)

(52) U.S. Cl.
CPC .............. *H10P 74/20* (2026.01); *H10P 74/23* (2026.01); *H10P 90/00* (2026.01)

(58) Field of Classification Search
CPC .......... H10P 70/15; H10P 74/20; H10P 74/23; H10P 74/203; H10P 76/204; H10P 90/12;
(Continued)

(56) References Cited

U.S. PATENT DOCUMENTS

2005/0176605 A1* 8/2005 Lassila .............. H01L 21/02052
510/175
2020/0387072 A1 12/2020 Nishimaki et al.
2021/0166365 A1 6/2021 Inoue et al.

FOREIGN PATENT DOCUMENTS

CN 103887178 A 6/2014
JP H02-285627 A 11/1990
(Continued)

OTHER PUBLICATIONS

JP 5314990B2, The Resist Composition And a Method of Forming a Resist Pattern, Oct. 16, 2013. (Year: 2013).*
(Continued)

*Primary Examiner* — Alexander G Ghyka
(74) *Attorney, Agent, or Firm* — OLIFF PLC.

(57) ABSTRACT

A method for detecting impurities on a surface of a silicon wafer for manufacturing semiconductors, the impurities not being able to be detected by a conventional inspection method, a method for manufacturing the silicon wafer for manufacturing semiconductors having the impurities removed from the surface thereof, and a method for screening wafers for manufacturing semiconductors. This method for detecting impurities on a surface of a wafer for manufacturing semiconductors includes: a step for coating the surface of the wafer with a film-forming composition, and performing baking to form a film; and then a step for detecting impurities by means of a wafer inspection tool.

6 Claims, 2 Drawing Sheets

(58) Field of Classification Search
CPC ......... H01L 22/10; H01L 22/12; H01L 22/20; H01L 21/02005; H01L 21/02052; H01L 21/0273; H01L 21/02002
See application file for complete search history.

(56) References Cited

FOREIGN PATENT DOCUMENTS

| | | | |
|---|---|---|---|
| JP | H11-191524 | A | 7/1999 |
| JP | 2014-20961 | A | 2/2014 |
| WO | 2019/163834 | A1 | 8/2019 |
| WO | 2019/244696 | A1 | 12/2019 |

OTHER PUBLICATIONS

Mack, C.A., "Semiconductor Lithography (Photolithography)—The Basic Process," The Basics of Microlithography, Aug. 12, 2020, retrieved from https://web.archive.Org/web/20200812020636/https://www.lithoguru.com/scientist/lithobasics.html.

Schnattinger, T., "Mesoscopic Simulation of Photoresist Processing in Optical Lithography," Feb. 25, 2008, retrieved from http://publica.fraunhofer.de/eprints/urn:nbn:de:0011-n-682438.pdf.

Huang, J. et al., "Narrow-band Thermal Radiation Based on Microcavity Resonant Effect," Chinese Physics Letters, vol. 31, No. 9, 2014, pp. 094207-1 to 094207-4.

Tang, I. et al., "Applications of piezoelectric ZnO film deposited on diamond-like carbon coated onto Si substrate under fabricated diamond SAW filter," Journal of Crystal Growth, vol. 262, 2004, pp. 461-466.

Feb. 26, 2024 Office Action issued in European Patent Application No. 21864456.5.

Nov. 2, 2021 International Search Report issued in International Patent Application No. PCT/JP2021/032640.

Mar. 7, 2023 International Preliminary Report on Patentability issued in International Patent Application No. PCT/JP2021/032640.

* cited by examiner

WAFER TREATMENT METHOD

TECHNICAL FIELD

The present application relates to methods for treating a wafer, such as a method for detecting impurities on a surface of a silicon wafer for manufacturing a semiconductor, a method for manufacturing a wafer for manufacturing a semiconductor from which impurities on a surface of the wafer have been removed, and a method for selecting a wafer for manufacturing a semiconductor.

BACKGROUND ART

There is a demand for reducing impurities such as foreign matters on a surface of a wafer formed of a material such as silicon used in manufacturing a semiconductor as much as possible.

Patent Literature 1 describes a method for detecting foreign matters that permits detection of foreign matters buried in a photoresist coating film with high reliability using a reflective subject in which the photoresist coating film is formed on a semiconductor substrate such as a silicon substrate.

CITATION LIST

Patent Literature

Patent Literature 1: JP 2014-20961 A

SUMMARY OF INVENTION

Technical Problem

Provided are a method for detecting impurities on a surface of a silicon wafer for manufacturing a semiconductor that cannot be detected by a conventional inspection method, a method for manufacturing a wafer for manufacturing a semiconductor from which impurities on a surface of the wafer have been removed, and a method for selecting a wafer for manufacturing a semiconductor.

Solution to Problem

The present invention encompasses the followings.

[1] A method for detecting impurities on a surface of a wafer for manufacturing a semiconductor, comprising the steps of:

coating a film-forming composition to a surface of the wafer and baking the film-forming composition to form a film; and detecting impurities with a wafer inspection tool.

[2] The method for detecting impurities according to [1], wherein the impurities contain fluorine atom.

[3] The method for detecting impurities according to [1] or [2], wherein the film-forming composition contains a resin.

[4] The method for detecting impurities according to any one of [1] to [3], wherein the film-forming composition is a composition for forming a coating film for lithography.

[5] The method for detecting impurities according to any one of [1] to [4], wherein the film-forming composition is a resist underlayer film-forming composition.

[6] A method for manufacturing a wafer for manufacturing a semiconductor, which has a surface from which impurities have been removed, comprising the steps of:

(A) heating a bare wafer (I) for manufacturing a semiconductor to 100° C. to 500° C. and/or cleaning a bare wafer (I) for manufacturing a semiconductor with ultrapure water;

(B) inspecting a wafer (II) for manufacturing a semiconductor subjected to step (A) by the method for detecting impurities according to any one of [1] to [5]; and (C) selecting a wafer (IV) for manufacturing a semiconductor in which defects present on a surface thereof has been reduced by 80% or more in number compared to the bare wafer (I) for manufacturing a semiconductor out of wafers (III) for manufacturing a semiconductor subjected to step (B).

[7] A method for selecting a wafer for manufacturing a semiconductor, comprising the steps of:

(A) heating a bare wafer (I) for manufacturing a semiconductor to 100° C. to 500° C. and/or cleaning a bare wafer (I) for manufacturing a semiconductor with ultrapure water;

(B) inspecting a wafer for manufacturing a semiconductor subjected to step (A) by the method for detecting impurities according to any one of [1] to [5]; and (C) selecting a wafer (IV) for manufacturing a semiconductor in which defects present on a surface thereof has been reduced by 80% or more in number compared to the bare wafer for manufacturing a semiconductor out of wafers (III) for manufacturing a semiconductor subjected to step (B), wherein step (C) includes dividing the wafers (III) for manufacturing a semiconductor subjected to step (B) into a wafer (IV) for manufacturing a semiconductor in which defects present on a surface thereof has been reduced by 80% or more in number compared to the bare wafer (I) for manufacturing a semiconductor, and a wafer (V) for manufacturing a semiconductor in which defects present on a surface thereof has been reduced by less than 80% in number compared to the bare wafer (I) for manufacturing a semiconductor, and selecting the wafer (IV) for manufacturing a semiconductor.

Advantageous Effects of Invention

According to the method of the present application, it is possible to detect the presence of impurities that are present on the surface of the wafer for manufacturing a semiconductor and would be removed by a heating and/or ultrapure water cleaning treatment. The impurities may contain fluorine atom. It is possible to manufacture and select a wafer for manufacturing a semiconductor (the so-called bare wafer) from which impurities that could not be detected without using the detection method have been removed.

DESCRIPTION OF EMBODIMENTS

Figure 1:
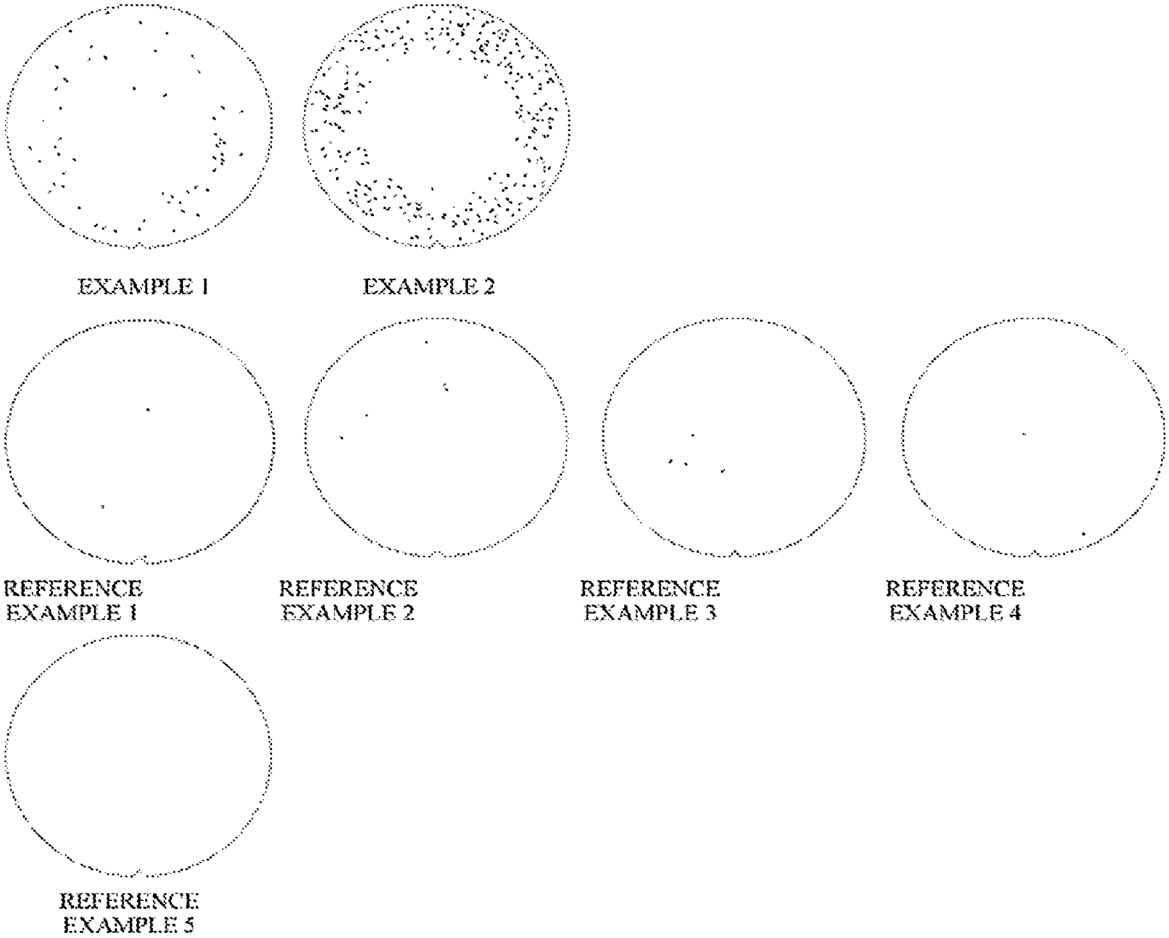
FIG. 1 is a schematic view of a defect distribution in a silicon wafer obtained in each of Examples 1 and 2 and Reference Examples 1 to 5.

<Method for Detecting Impurities on Surface of Wafer for Manufacturing Semiconductor>

A method for detecting impurities on a surface of a wafer for manufacturing a semiconductor of the present application comprises the steps of:

coating a film-forming composition to a surface of the wafer and baking the film-forming composition to form a film; and detecting impurities with a wafer inspection tool.

The impurities may contain fluorine atom.

The wafer for manufacturing a semiconductor is a wafer used for manufacturing a semiconductor element or the like; and examples thereof include a generally used silicon wafer and germanium wafer, and a compound semiconductor wafer formed by bonding two or more elements such as gallium arsenide, indium phosphide, gallium nitride, indium nitride, and aluminum nitride. The wafer for manufacturing a semiconductor usually has a disk shape, and a size thereof is, for example, 4, 6, 8, or 12 inches, and so on. A commercially available product may be used.

A film-forming composition (an organic film-forming composition or an inorganic film-forming composition) described below is coated onto a wafer for manufacturing a semiconductor by an appropriate coating method such as a spinner or a coater. Thereafter, a film (an organic film or an inorganic film) is formed by performing baking using heating means such as a hot plate. The conditions for baking are appropriately selected from a baking temperature of 100° C. to 400° C. and a baking time of 0.3 minutes to 60 minutes. Preferably, the baking temperature is 120° C. to 400° C., the baking temperature is 120° C. to 350° C., and the baking time is 0.5 minutes to 30 minutes, and more preferably, the baking temperature is 150° C. to 300° C. and the baking time is 0.8 minutes to 10 minutes. The thickness of the film to be formed is within the range of 0.01 μm (10 nm) to 2 μm (2,000 nm), 0.02 μm (20 nm) to 1 μm (1,000 nm), 0.025 μm (25 nm) to 1 μm (1,000 nm), 0.02 μm (20 nm) to 0.9 μm (900 nm), 0.025 μm (25 nm) to 0.9 μm (900 nm), 0.02 μm (20 nm) to 0.8 μm (800 nm), or 0.025 μm (25 nm) to 0.8 μm (800 nm). The film thickness is preferably uniform (for example, the film thickness is within a film thickness intermediate value ±20%, ±10%, ±5%, ±3%, or ±1%) in a wafer plane.

As the wafer inspection tool, a commercially available product may be used. Specific examples thereof include a wafer inspection system Surfscan series manufactured by KLA-Tencor Corporation.

<Film-Forming Composition>

The film-forming composition used in the present application is not particularly limited as long as it can form a film of uniform thickness. Any of an organic film-forming composition and an inorganic film-forming composition may be used, but it is preferable to use a composition for forming a coating film for lithography used in a lithography process at the time of manufacturing a semiconductor device, which contains few impurities contained in a film so as to enable carrying out the method for detecting impurities, the method for manufacturing a wafer for manufacturing a semiconductor, and the method for selecting a wafer for manufacturing a semiconductor of the present application, as well as permits formation of a film at a constant thickness in a wafer plane.

It is preferable that the film-forming composition contains a resin. The resin is also referred to as a polymer, a polymerized product, a copolymer, a compound of high molecular weight, or the like. The resin of the present application may be either an organic resin or an inorganic resin (for example, a hydrolyzed condensate of a silane compound, polysiloxane, or the like).

Examples of the composition for forming a coating film for lithography used in the present application include a known photoresist composition, a known resist underlayer film-forming composition (containing an organic compound and/or an inorganic compound), a known protective film-forming composition for protecting a substrate from an etching chemical during semiconductor substrate processing, a known underlayer film-forming composition for a self-assembled film, a known upper layer film-forming composition for a self-assembled film, and a known resist upper layer film-forming composition described below, but are not limited thereto.

An exposure wavelength in the lithography process may be an i-line, a KrF excimer laser, an ArF excimer laser, an extreme ultraviolet ray (EUV), or an electron beam (EB). The composition for forming a coating film for lithography is preferably a composition for forming a coating film for lithography corresponding to these exposure wavelengths.

Specific examples of the composition for forming a coating film for lithography may include a resist upper layer film-forming composition for a resist upper layer film described in WO 2014/115843 A, WO 2015/129486 A, and the like; an underlayer film-forming composition for a self-assembled film using a block copolymer self-assembly (direct self assembly (DSA)) technique described in WO 2013/146600 A, WO 2014/097993 A, and the like; an upper layer film-forming composition for the self-assembled film described in WO 2018/051907 A; and a coating composition for pattern reversal described in WO 2016/031563 A and WO 2017/145809 A.

Other specific examples of the composition for forming a coating film for lithography may include a composition for forming a protective film, a composition for forming a resist underlayer film, and a composition for forming a silicon-containing resist underlayer film described in WO 2009/096340 A, JP 2009-053704 A, WO 2010/147155 A, WO 2011/102470 A, WO 2011/021555 A, WO 2013/047516 A, WO 2015/030060 A, WO 2018/052130 A, WO 2019/124474 A, WO 2019/124475 A, WO 2019/151471 A, WO 2019/163834 A, PCT/JP 2019/042708 A, PCT/JP 2020/001627 A, PCT/JP 2020/018436 A, and the like.

A solid content in the composition for forming a coating film for lithography according to the present invention is usually within the range of 0.1 to 70% by mass, preferably 0.1 to 60% by mass, and more preferably 0.1 to 40% by mass. The solid content is a content ratio of all components excluding a solvent from the composition for forming a coating film for lithography. A ratio of the polymer in the solid content is, for example, within the range of 30 to 100% by mass, 50 to 100% by mass, 60 to 100% by mass, 70 to 100% by mass, 80 to 100% by mass, 60 to 99.9% by mass, 60 to 99% by mass, 60 to 98% by mass, 60 to 97% by mass, 60 to 96% by mass, 60 to 95% by mass, 70 to 99.9% by mass, 70 to 99% by mass, 70 to 98% by mass, 70 to 97% by mass, 70 to 96% by mass, or 70 to 95% by mass.

Of these, a resist underlayer film-forming composition is preferable, and as a preferred specific example, a resist underlayer film-forming composition containing a triaryldiamine-containing novolak resin to which an aromatic vinyl compound has been added described in WO 2019/

163834 A is preferable. The resist underlayer film-forming composition contains a novolak resin having a structural group (C) formed by a reaction between a vinyl group of an aromatic vinyl compound (B) and an aromatic ring of an aromatic compound (A) containing at least two amino groups and three aromatic rings having 6 to 40 carbon atoms.

The structural group (C) is preferably represented by the following Formula (1):

[Chem. 1]

Formula (1)

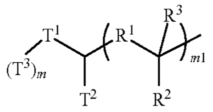

[in Formula (1), $R^1$ is a divalent group containing at least two amino groups and at least three aromatic rings having 6 to 40 carbon atoms, $R^2$ and $R^3$ are each independently a hydrogen atom, an alkyl group having 1 to 10 carbon atoms, an aryl group having 6 to 40 carbon atoms, a heterocyclic group, or a combination thereof, each of the alkyl group, the aryl group, and the heterocyclic group is an organic group which may be substituted with a halogen atom, a nitro group, an amino group, an alkyl group having 1 to 10 carbon atoms, an aryl group having 6 to 40 carbon atoms, a formyl group, a carboxy group, an alkoxy group, or a hydroxy group, and $R^2$ and $R^3$ may form a ring together with a carbon atom to which they are attached, $T^1$ is an arylene group having 6 to 40 carbon atoms, and $T^3$ represents an alkyl group having 1 to 10 carbon atoms, an alkenyl group having 2 to 10 carbon atoms, an alkynyl group having 2 to 10 carbon atoms, an aryl group having 6 to 40 carbon atoms, a hydroxy group, a cyano group, a nitro group, an amino group, a carboxy group, an acetyl group, a hydroxymethyl group, a halogenomethyl group, a —Y—Z group, a halogen atom, or a combination thereof. Y represents an oxygen atom, a sulfur atom, a carbonyl group, or an ester group, and Z represents an alkyl group having 1 to 10 carbon atoms.

$T^2$ represents a hydrogen atom, a methyl group, or a phenyl group.

m is an integer of 0 to (5+2n), n represents a degree of condensation of an aromatic ring constituting an arylene group that $T^1$ defines, and m1 is an integer of 2 to 3,600].

$R^1$ is preferably a divalent organic group obtained by removing two hydrogen atoms from an aromatic ring of a compound represented by the following Formula (2):

[Chem. 2]

Formula (2)

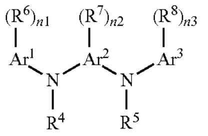

[in Formula (2), $Ar^1$, $Ar^2$, and $Ar^3$ each independently represent a benzene ring or a naphthalene ring, $R^6$, $R^7$, and $R^8$ are each independently selected from the group consisting of a halogen atom, a nitro group, an amino group, a hydroxy group, an alkyl group having 1 to 10 carbon atoms, an alkenyl group having 2 to 10 carbon atoms, an aryl group having 6 to 40 carbon atoms, and a combination thereof, which is a substituent on these rings, and each of the alkyl group, the alkenyl group, and the aryl group represents an organic group which may contain an ether bond, a ketone bond, or an ester bond, $R^4$ and $R^5$ are each independently selected from the group consisting of a hydrogen atom, an alkyl group having 1 to 10 carbon atoms, an alkenyl group having 2 to 10 carbon atoms, an aryl group having 6 to 40 carbon atoms, and a combination thereof, and each of the alkyl group, the alkenyl group, and the aryl group represents an organic group which may contain an ether bond, a ketone bond, or an ester bond, each of n1, n2, and n3 is equal to or greater than 0, and each of $R^6$, $R^7$, and $R^8$ is an integer up to a maximum number that can be substituted].

The structural group (C) is preferably the following Formula (1-1):

[Chem. 3]

Formula (1-1)

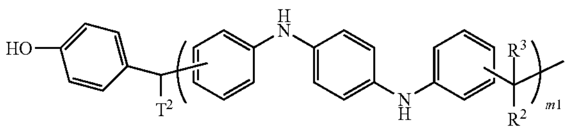

[in Formula (1-1), $R^2$ and $R^3$ are each independently a hydrogen atom, an alkyl group having 1 to 10 carbon atoms, an aryl group having 6 to 40 carbon atoms, a heterocyclic group, or a combination thereof, each of the alkyl group, the aryl group, and the heterocyclic group is an organic group which may be substituted with a halogen atom, a nitro group, an amino group, an alkyl group having 1 to 10 carbon atoms, an aryl group having 6 to 40 carbon atoms, a formyl group, a carboxy group, an alkoxy group, or a hydroxy group, and $R^2$ and $R^3$ may form a ring together with a carbon atom to which they are attached, $T^2$ represents a hydrogen atom, a methyl group, or a phenyl group, and m1 is an integer of 2 to 3,600].

In addition, the entire disclosure of WO 2019/163834 A is incorporated in the present application by reference.

In addition, the resist underlayer film-forming composition is preferably a composition for forming a resist underlayer film for lithography, which contains a resin containing an aliphatic ring and an aromatic ring described in WO 2011/021555 A. The composition for forming a resist underlayer film for lithography is a composition for forming a resist underlayer film, which contains a reaction product (C') of an alicyclic epoxy polymer (A') and a condensed cyclic aromatic carboxylic acid and a monocyclic aromatic carboxylic acid (B').

Preferred is a resist underlayer film-forming composition, in which (A') has a repeating unit structure represented by Formula (11):

[Chem. 4]

Formula (11)

(in Formula (11), T represents a repeating unit structure having an aliphatic ring in the main chain of the polymer, and E is an epoxy group or an organic group having an epoxy group).

The (C') is preferably a polymer represented by Formula (12):

[Chem. 5]

Formula (12)

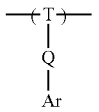

(in Formula (12), T represents a repeating unit structure having an aliphatic ring in the main chain of the polymer, Q is a linking group between T and an aromatic condensed ring and an aromatic monocyclic ring, and Ar is an aromatic condensed ring or an aromatic monocyclic ring).

Preferably, the reaction product (C') is a polymer of which the repeating unit structures, Formula (13), Formula (14), and Formula (15):

[Chem. 6]

Formula (13)

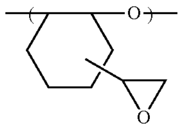

Formula (14)

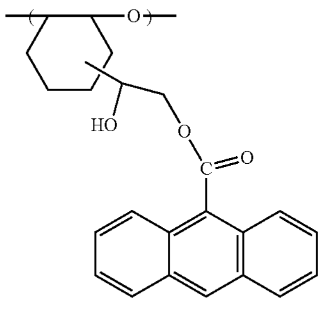

-continued

Formula (15)

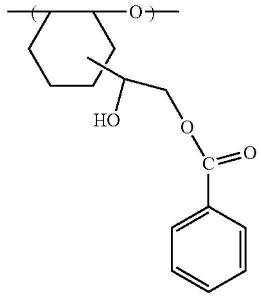

meet 0≤a≤0.2, 0.3≤b≤0.7, 0.3≤c≤0.7, and 0.5≤b+c≤1.0, in which a is the number of repeating unit structure of Formula (13), b is the number of repeating unit structure of Formula (14), and c is the number of repeating unit structure of Formula (15), when the total number of unit structures included in the reaction product (C') is taken as 1.0.

In addition, the entire disclosure of WO 2011/021555 A is incorporated in the present application by reference.

As an example of a specific structure of a preferred resin (polymer), it is preferable that the resin has a unit structure represented by the following Formula (21):

[Chem. 7]

(21)

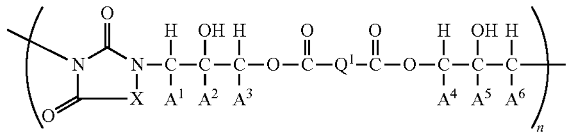

[in Formula (21), X represents a group represented by the following Formula (22), Formula (23), or Formula (24):

[Chem. 8]

(22)

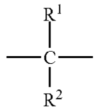

(23)

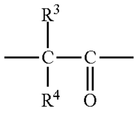

(24)

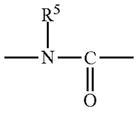

(in Formula (22), Formula (23), or Formula (24), $R^1$ to $R^5$ each independently represent a hydrogen atom, an alkyl group having 1 to 6 carbon atoms, an alkenyl group having 2 to 6 carbon atoms, a benzyl group, or a phenyl group, the phenyl group may be substituted with at least one group selected from the group consisting of an alkyl group having 1 to 6 carbon atoms, a halogen atom, an alkoxy group having 1 to 6 carbon atoms, a nitro group, a cyano group, and an alkylthio group having 1 to 6 carbon atoms, and $R^1$ and $R^2$, and $R^3$ and $R^4$ may be bonded to each other to form a ring having 3 to 6 carbon atoms, $A^1$ to $A^6$ each independently represent a hydrogen atom, a methyl group, or an ethyl group, $Q^1$ represents a divalent group containing a disulfide bond, and preferably represents a divalent group containing an alkylene group having 1 to 6 carbon atoms at both ends of the disulfide bond, and n is the number of repeating unit structures and represents an integer from 5 to 100].

Examples of the resin (polymer) of the present application include, but are not limited to, a polymer described in WO 2009/096340 A, and a reaction product of a bi- or higher-functional compound having at least one disulfide bond and a tri- or higher-functional compound described in WO 2019/151471 A.

In a case where the polymer is a reaction product of a bifunctional compound (A") having at least one disulfide bond and a bifunctional compound (B") different from the compound (A"), the disulfide bond is present in the main chain in the polymer.

The polymer may have a repeating unit structure represented by the following Formula (31):

[Chem. 9]

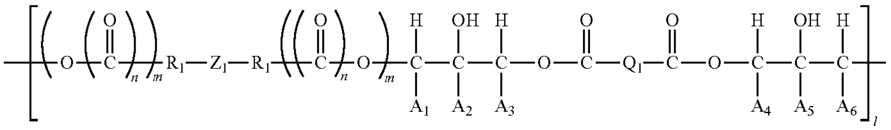

(31)

(in Formula (31), $R_1$ represents an alkyl group having 0 or 1 carbon atom, n is the number of repeating unit structures and represents an integer of 0 or 1, m represents an integer of 0 or 1, and $Z_1$ represents a group represented by Formula (32), Formula (33), or Formula (34):

[Chem. 10]

(32)

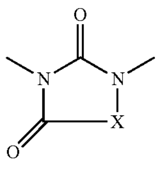

(33)

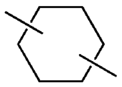

(34)

in Formula (33), X represents a group represented by the following Formula (44), Formula (45), or Formula (46):

[Chem. 11]

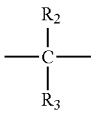

(44)

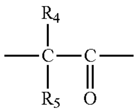

(45)

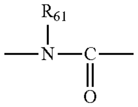

(46)

in Formula (44), Formula (45), and Formula (46), $R_2$ to $R_{61}$ ($R_2$, $R_3$, $R_4$, $R_{51}$, and $R_{61}$) each independently represent a hydrogen atom, an alkyl group having 1 to 6 carbon atoms, an alkenyl group having 3 to 6 carbon atoms, a benzyl group, or a phenyl group, the phenyl group may be substituted with at least one group selected from the group consisting of an alkyl group having 1 to 6 carbon atoms, a halogen atom, an alkoxy group having 1 to 6 carbon atoms, a nitro group, a cyano group, and an alkylthio group having 1 to 6 carbon atoms, and $R_2$ and $R_3$, and $R_4$ and $R_5$ may be bonded to each other to form a ring having 3 to 6 carbon atoms.

$A_1$ to $A_6$ each independently represent a hydrogen atom, a methyl group, or an ethyl group, $Q_1$ represents an alkylene group having 1 to 10 carbon atoms interrupted by a disulfide bond, and 1 is the number of repeating unit structures and represents an integer of 5 to 100).

$Q_1$ is preferably an alkylene group having 2 to 6 carbon atoms interrupted by a disulfide bond.

Examples of the "ring having 3 to 6 carbon atoms" include cyclopropane, cyclobutane, cyclopentane, cyclopentadiene, and cyclohexane.

Formula (31) may be represented by the following Formula (55):

[Chem. 12]

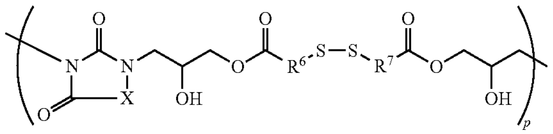

(55)

[in Formula (55), X represents a group represented by Formula (44), Formula (45), or Formula (46), $R^6$ and $R^7$ each independently represent an alkylene group having 1 to 3 carbon atoms or a direct bond, and p is the number of repeating unit structures and represents an integer of 5 to 100].

The polymer is preferably represented by the following (Formula P-6) to (Formula P-8).

[Chem. 13]

(Formula P-6)

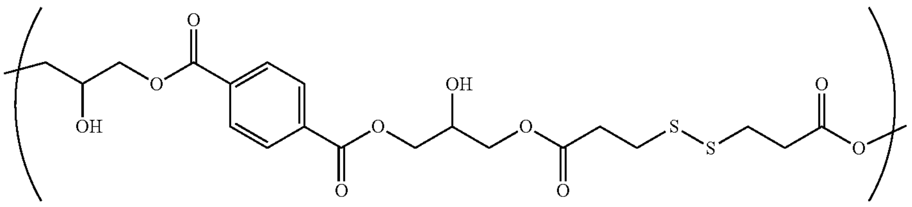

[Chem. 14]

(Formula P-7)

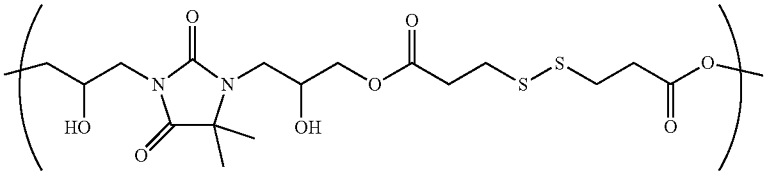

[Chem. 15]

(Formula P-8)

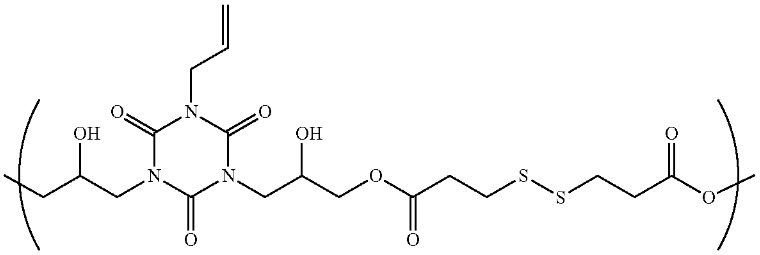

It is preferable that the resin (polymer) is a reaction product synthesized by reacting a bi- or higher-functional compound (A") having at least one disulfide bond with a bi- or higher-functional compound (B") by a method known per se.

The entire disclosures of WO 2009/096340 A and WO 2019/151471 A are incorporated in the present application by reference.

<Crosslinking Agent>

Examples of a crosslinking agent contained as an optional component in the film-forming composition of the present invention include hexamethoxymethylmelamine, tetramethoxymethyl benzoguanamine, 1,3,4,6-tetrakis(methoxymethyl)glycoluril (tetramethoxymethyl glycoluril) (POWDERLINK [registered trademark] 1174), 1,3,4,6-tetrakis (butoxymethyl)glycoluril, 1,3,4,6-tetrakis(hydroxymethyl) glycoluril, 1,3-bis(hydroxymethyl)urea, 1,1,3,3-tetrakis (butoxymethyl)urea, 1,1,3,3-tetrakis(methoxymethyl)urea, and 2,4,6-tris[bis(methoxymethyl)amino]-1,3,5-triazine ((trade name) Cymel [registered trademark]-303, NIKALAC [registered trademark] MW-390).

In addition, the crosslinking agent may contain a crosslinkable compound represented by the following Formula (71) or Formula (72) described in WO 2014/208542 A:

[Chem. 16]

Formula (71)

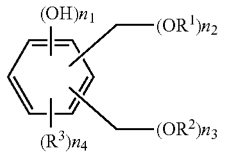

Formula (72)

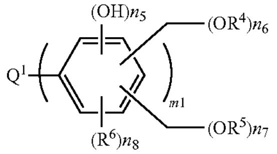

(in Formulas (71) and Formula (72), $Q^1$ represents a single bond or an m1-valent organic group, each of $R^1$ and $R^4$ represents an alkyl group having 2 to 10 carbon atoms, or an alkyl group having 2 to 10 carbon atoms, which contains an alkoxy group having 1 to 10 carbon atoms, each of $R^2$ and $R^5$ represents a hydrogen atom or a methyl group, and each of $R^3$ and $R^6$ represents an alkyl group having 1 to 10 carbon atoms or an aryl group having 6 to 40 carbon atoms, n1 represents an integer of $1 \leq n1 \leq 3$, n2 represents an integer of $2 \leq n2 \leq 5$, n3 represents an integer of $0 \leq n3 \leq 3$, n4 represents an integer of $0 \leq n4 \leq 3$, and n1, n2, n3, and n4 are an integer of $3 \leq (n1+n2+n3+n4) \leq 6$, n5 represents an integer of $1 \leq n5 \leq 3$, n6 represents an integer of $1 \leq n6 \leq 4$, n7 represents an integer of $0 \leq n7 \leq 3$, n8 represents an integer of 0≤n8≤3, and n5, n6, n7, and n8 are an integer of 2≤(n5+n6+n7+n8)≤5, and m1 represents an integer of 2 to 10)).

The crosslinkable compound represented by Formula (71) or Formula (72) may be obtained by a reaction of a compound represented by the following Formula (73) or Formula (74) with a hydroxy group-containing ether compound or an alcohol having 2 to 10 carbon atoms.

[Chem. 17]

Formula (73)

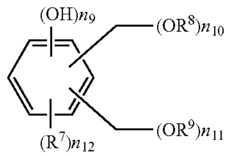

Formula (74)

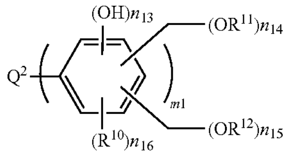

(In Formula (73) or Formula (74), $Q^2$ represents a single bond or an m2-valent organic group, each of $R^8$, $R^9$, $R^{11}$, and $R^{12}$ represents a hydrogen atom or a methyl group, and each of $R^7$ and $R^{10}$ represents an alkyl group having 1 to 10 carbon atoms or an aryl group having 6 to 40 carbon atoms, n9 represents an integer of 1≤n9≤3, n10 represents an integer of 2≤n10≤5, n11 represents an integer of 0≤n11≤3, n12 represents an integer of 0≤n12≤3, and n9, n10, n11, and n12 are an integer 3≤(n9+n10+n11+n12)≤6, n13 represents an integer of 1≤n13≤3, n14 represents an integer of 1≤n14≤4, n15 represents an integer of 0≤n15≤3, and n16 represents an integer of 0≤n16≤3, and n13, n14, n15, and n16 are an integer of 2≤(n13+n14+n15+n16)≤5, and m2 represents an integer of 2 to 10.)

The reaction of the compound represented by the following Formula (73) or Formula (74) with the hydroxy group-containing ether compound or the alcohol having 2 to 10 carbon atoms may be performed in the presence of an acid catalyst.

Examples of the crosslinkable compounds represented by Formula (71) and Formula (72) used in the present invention may include the following.

[Chem. 18]

Formula (3-1)

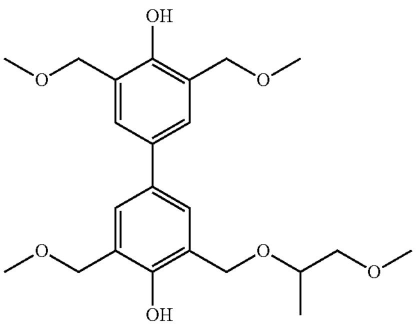

-continued

Formula (3-2)

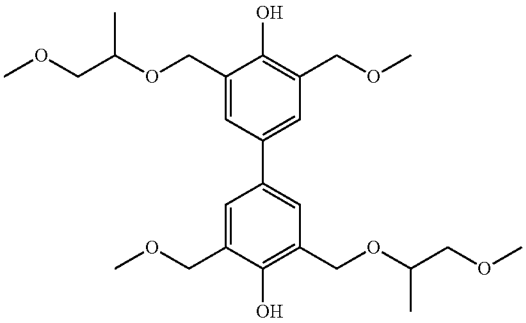

Formula (3-3)

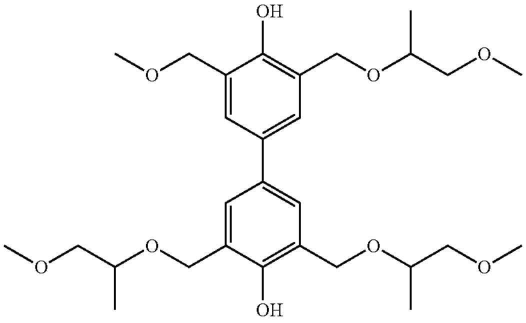

Formula (3-4)

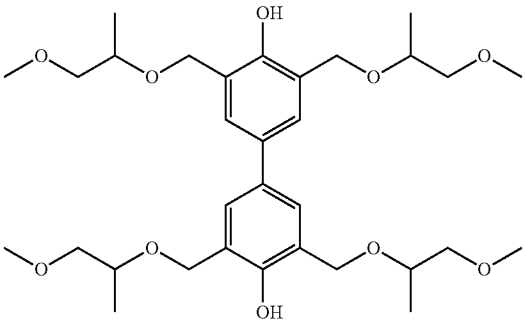

Formula (3-5)

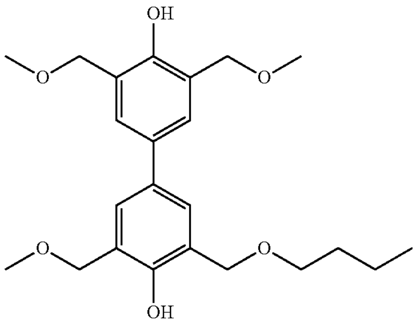

-continued
Formula (3-6)
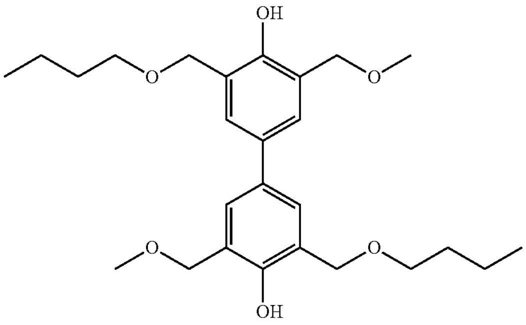
Formula (3-7)
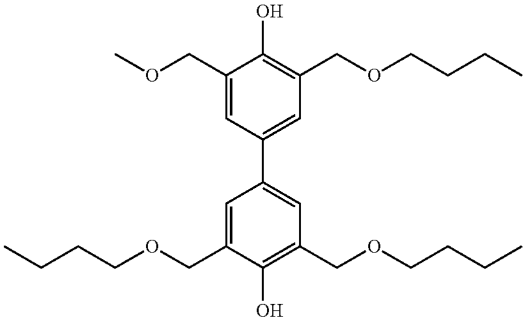
Formula (3-8)
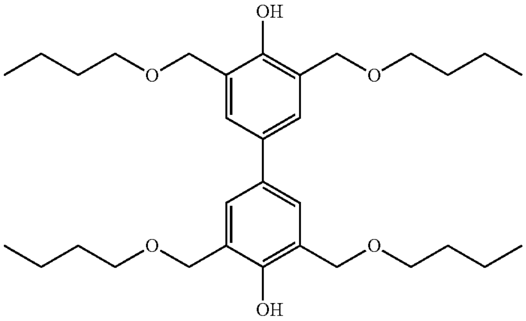
[Chem. 19]
Formula (3-9)
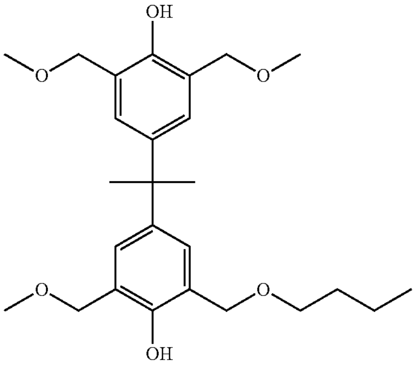
-continued
Formula (3-10)
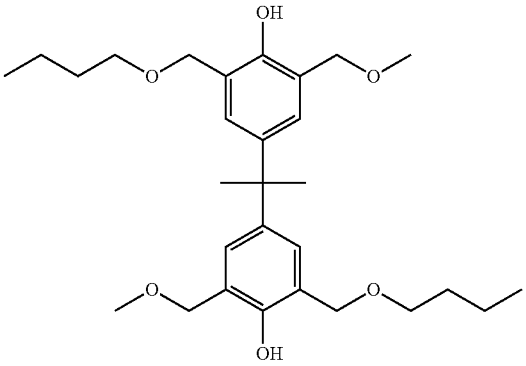
Formula (3-11)
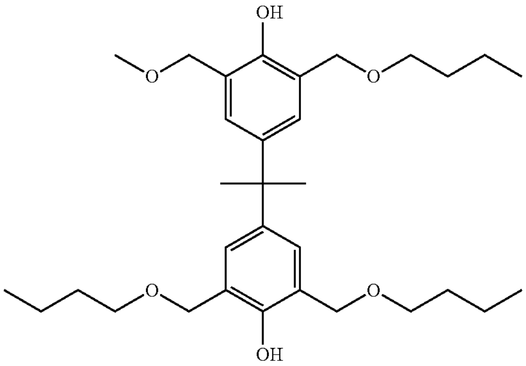
Formula (3-12)
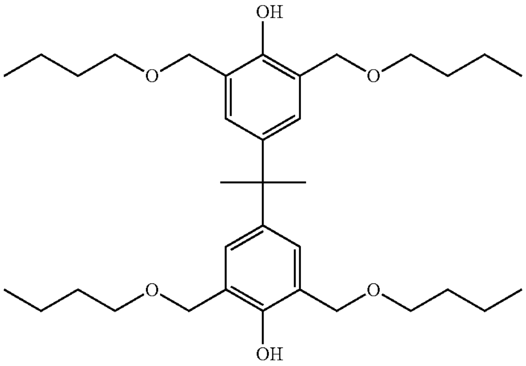
Formula (3-13)
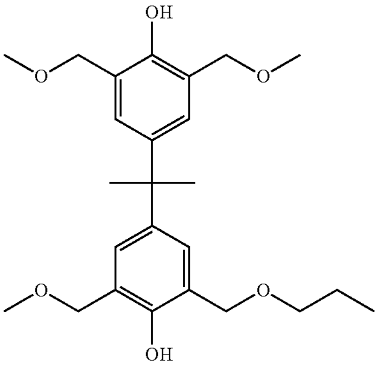

-continued
Formula (3-14)
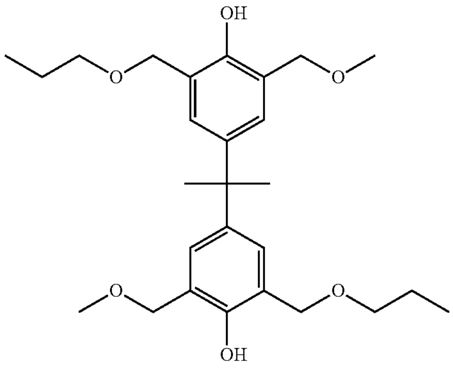
Formula (3-15)
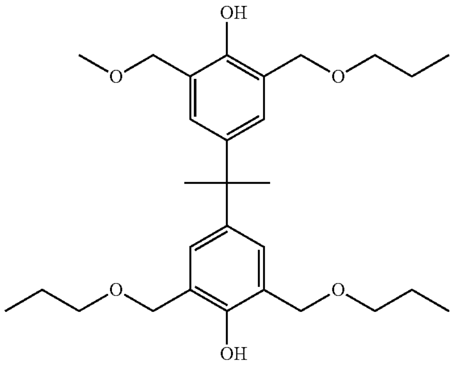
Formula (3-16)
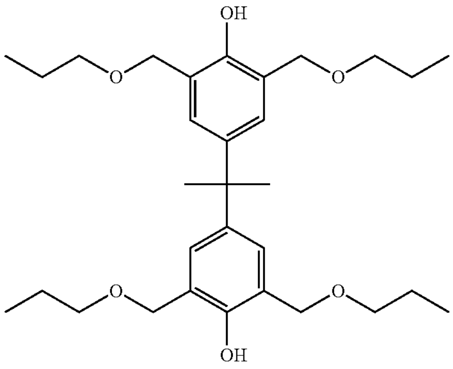
[Chem. 20]
Formula (3-17)
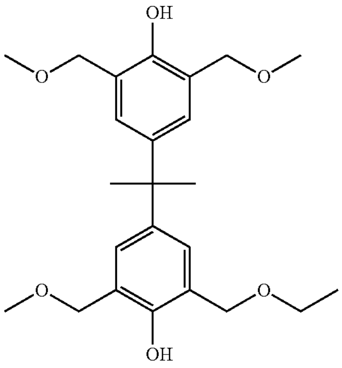
-continued
Formula (3-18)
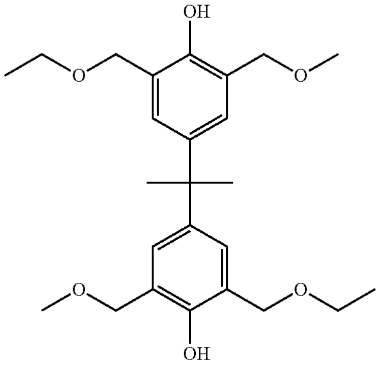
Formula (3-19)
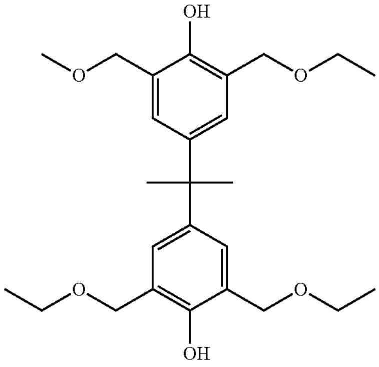
Formula (3-20)
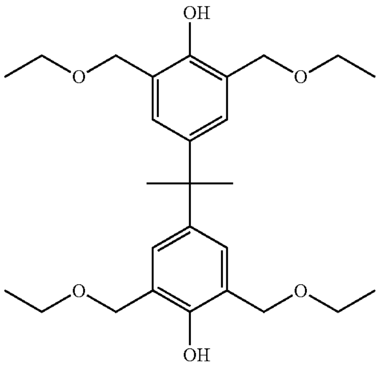
Formula (3-21)
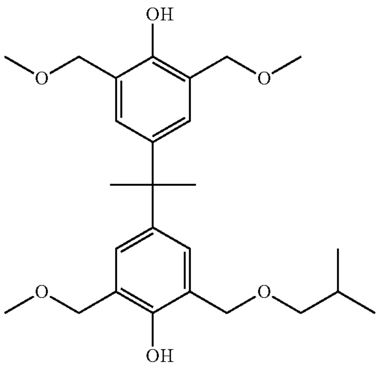

-continued
Formula (3-22)
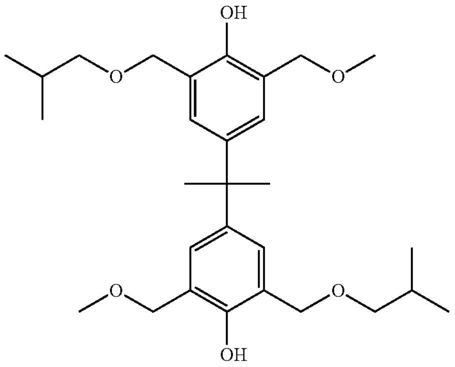
Formula (3-23)
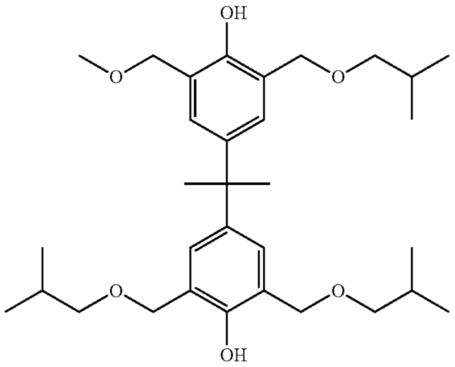
Formula (3-24)
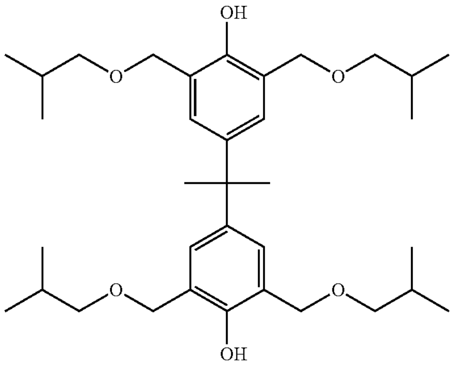
[Chem. 21]
Formula (3-25)
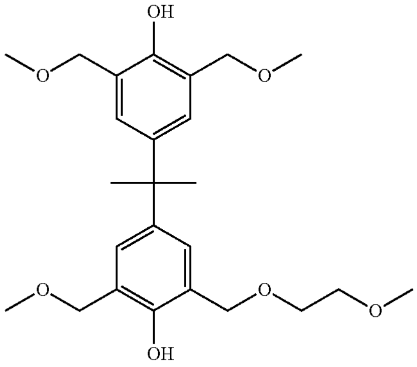
-continued
Formula (3-26)
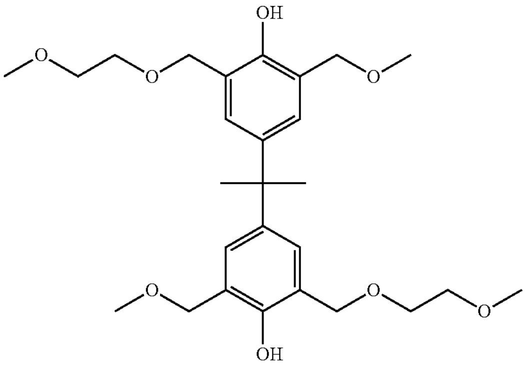
Formula (3-27)
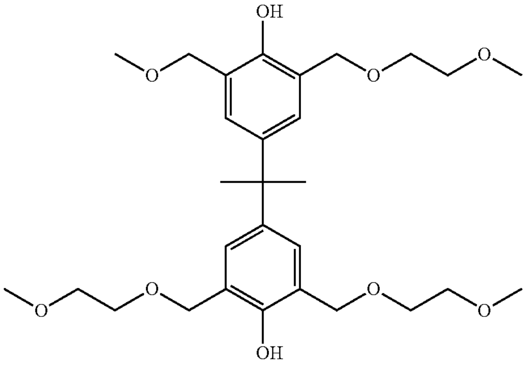
Formula (3-28)
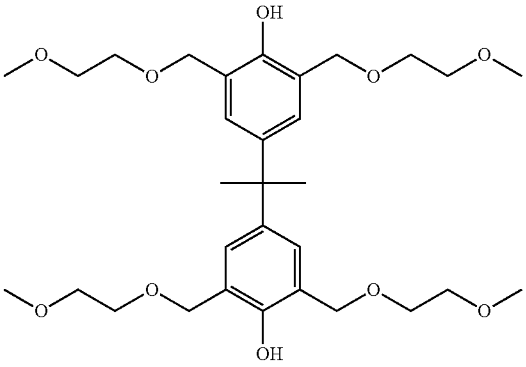
Formula (3-29)
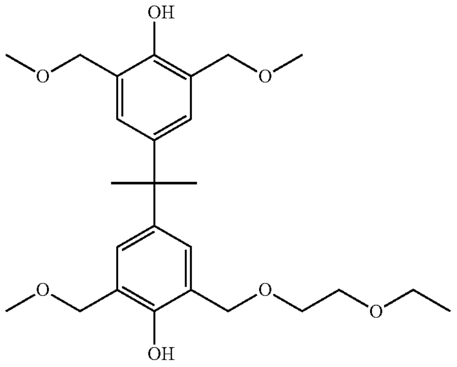

-continued
Formula (3-30)
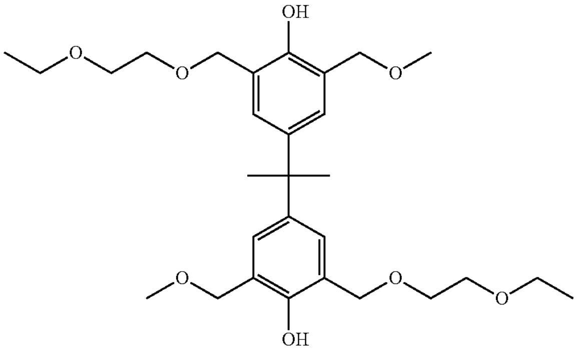
Formula (3-31)
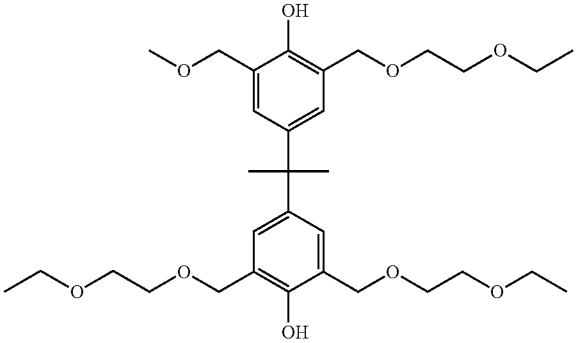
Formula (3-32)
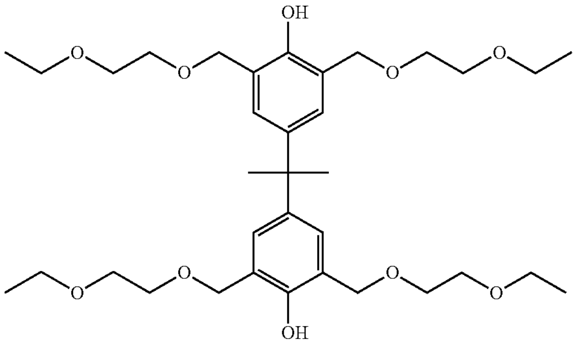
[Chem. 22]
Formula (3-33)
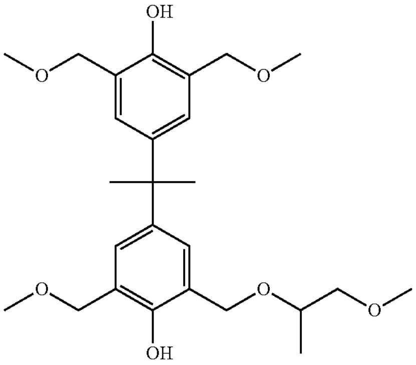
-continued
Formula (3-34)
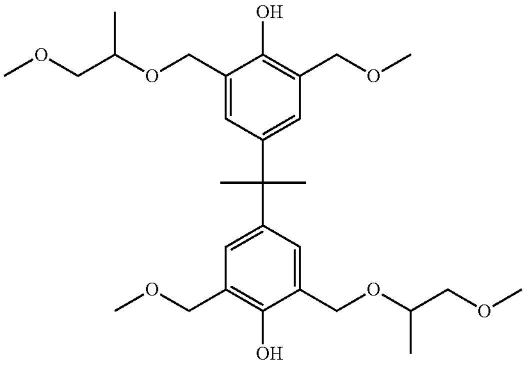
Formula (3-35)
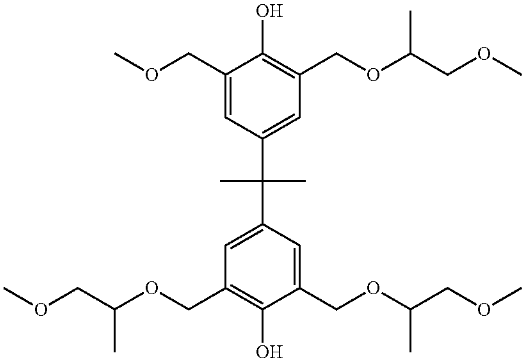
Formula (3-36)
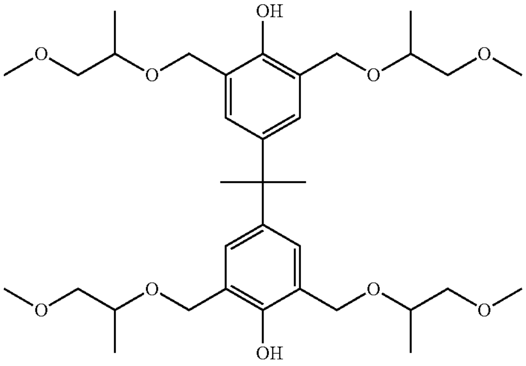
Formula (3-37)
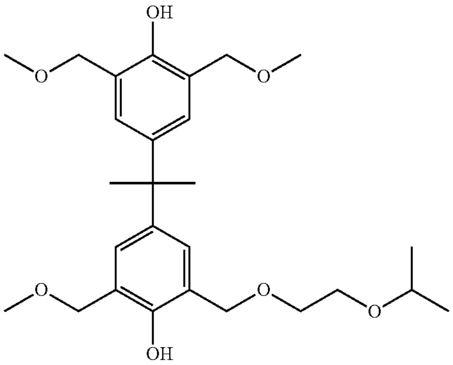

-continued
Formula (3-38)
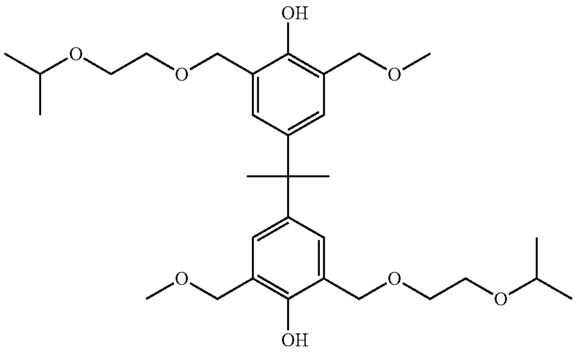
Formula (3-39)
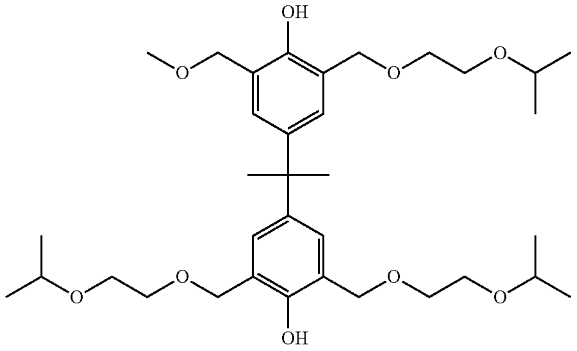
Formula (3-40)
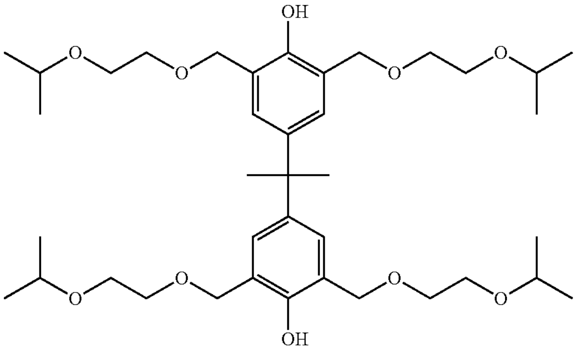
In addition, examples of the compounds represented by Formula (73) and Formula (74) used in the present invention may include the following.
[Chem. 23]
Formula (4-1)
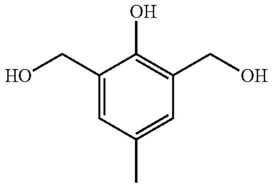
-continued
Formula (4-2)
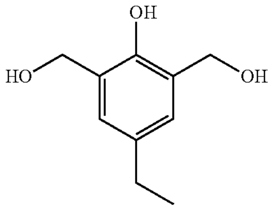
Formula (4-3)
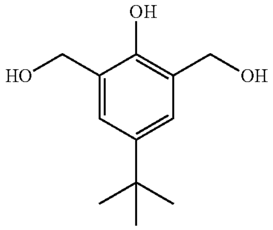
Formula (4-4)
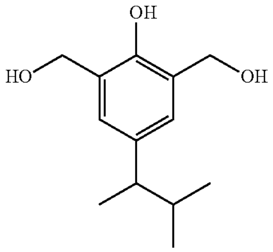
Formula (4-5)
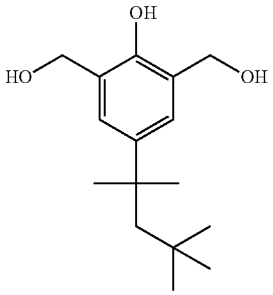
Formula (4-6)
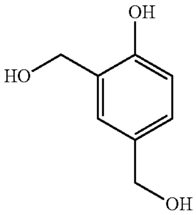
Formula (4-7)
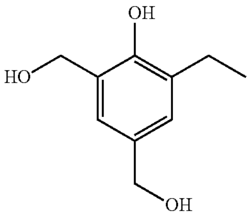

-continued
Formula (4-8)
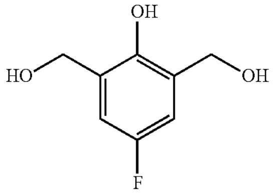
Formula (4-9)
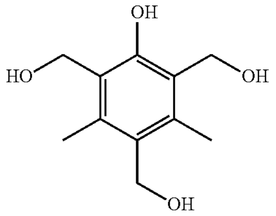
Formula (4-10)
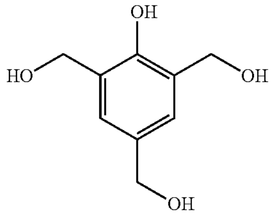
Formula (4-11)
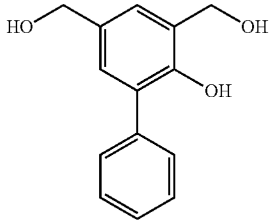
Formula (4-12)
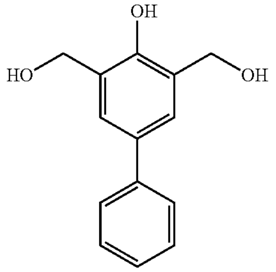
Formula (4-13)
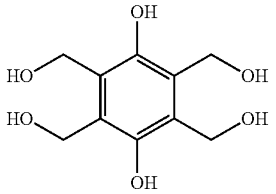
Formula (4-14)
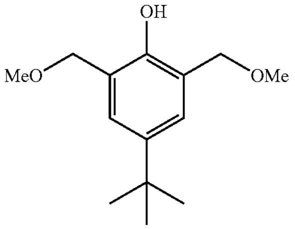
-continued
Formula (4-15)
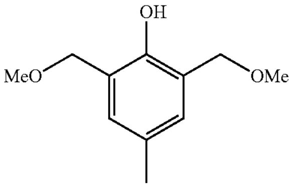
Formula (4-16)
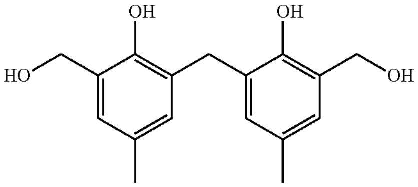
Formula (4-17)
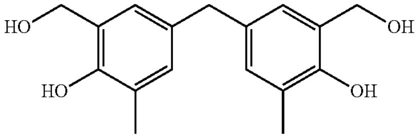
[Chem. 24]
Formula (4-18)
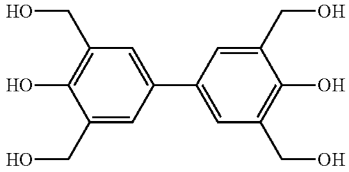
Formula (4-19)
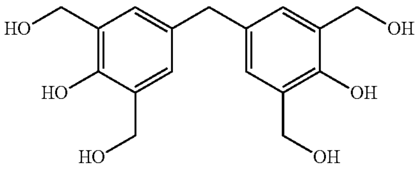
Formula (4-20)
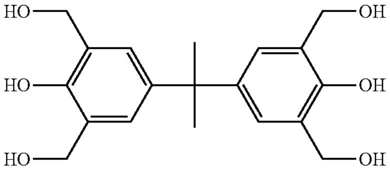
Formula (4-21)
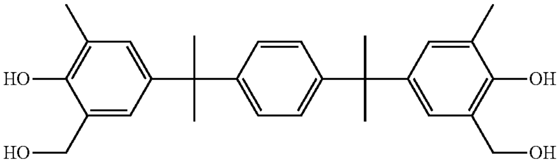
Formula (4-22)
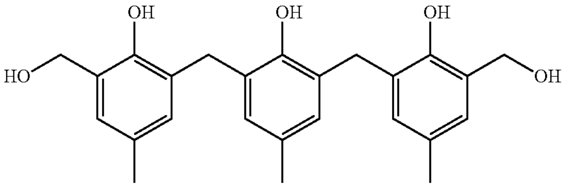

-continued

Formula (4-23)

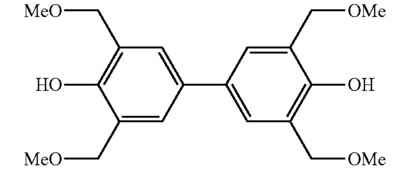

Formula (4-24)

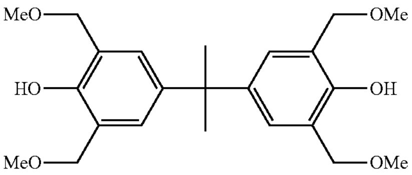

Formula (4-25)

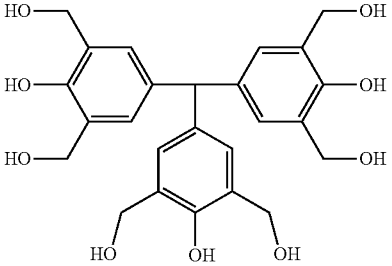

Formula (4-26)

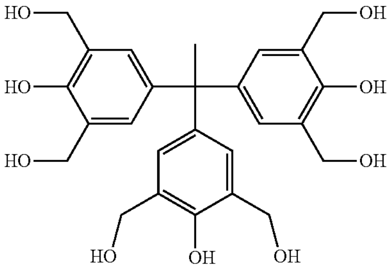

Formula (4-27)

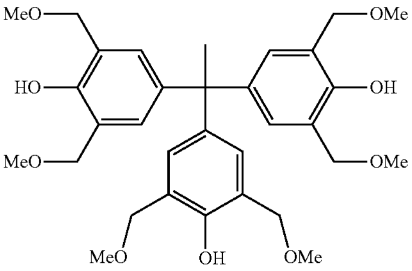

The entire disclosure of WO 2014/208542 A is incorporated in the present application by reference.

In addition, the crosslinking agent may be a nitrogen-containing compound having in the molecule 2 to 6 substituents represented by the following Formula (61) that links with a nitrogen atom, which is described in WO 2017/187969 A.

[Chem. 25]

(61)

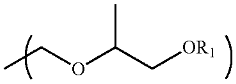

(In Formula (61), $R_1$ represents a methyl group or an ethyl group.)

The nitrogen-containing compound having 2 to 6 substituents represented by Formula (61) in the molecule may be a glycoluril derivative represented by the following Formula (1A).

[Chem. 26]

(1A)

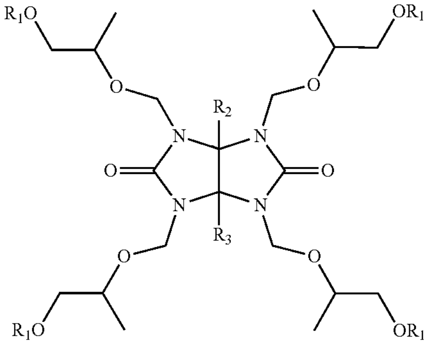

(In Formula (1A), four $R_1$'s each independently represent a methyl group or an ethyl group, and $R_2$ and $R_3$ each independently represent a hydrogen atom, an alkyl group having 1 to 4 carbon atoms, or a phenyl group.)

Examples of the glycoluril derivative represented by Formula (1A) include compounds represented by the following Formula (1A-1) to Formula (1A-6).

[Chem. 27]

(1A-1)

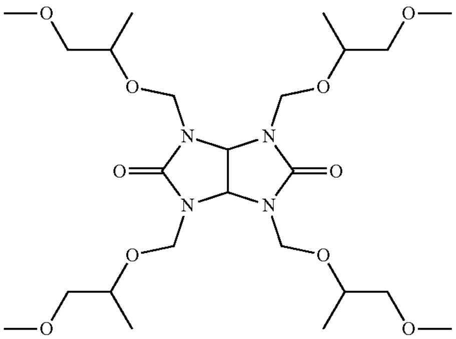

(1A-2)

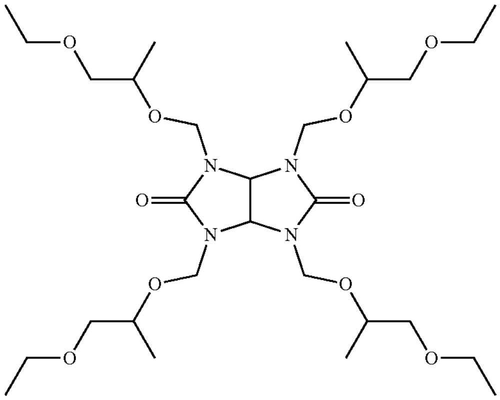

-continued (1A-3)

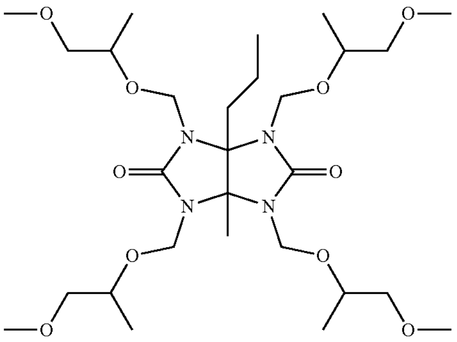

(1A-4)

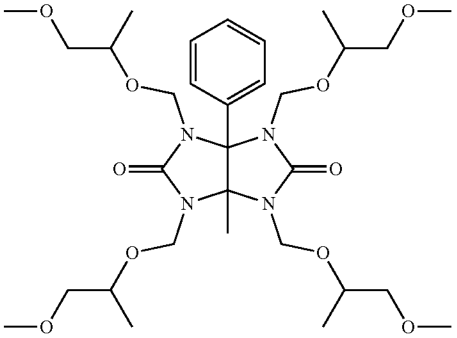

(1A-5)

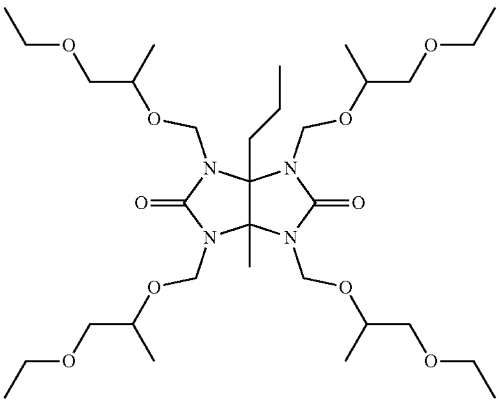

(1A-6)

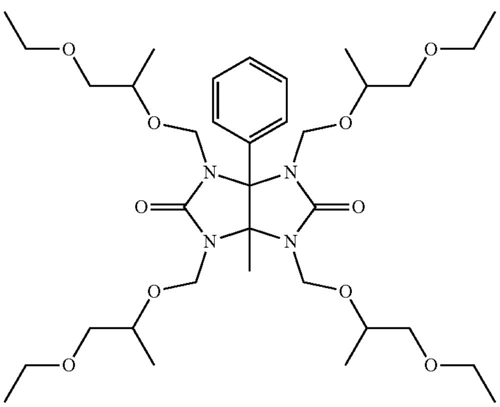

The compound represented by Formula (1A) is obtained by producing a nitrogen-containing compound having 2 to 6 substituents represented by Formula (61) in the molecule by reacting a nitrogen-containing compound having 2 to 6 substituents bonded to a nitrogen atom and represented by the following Formula (62) in the molecule with at least one compound represented by the following Formula (63).

[Chem. 28]

(62)

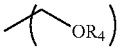

(63)

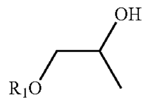

(In Formula (62) and Formula (63), $R_1$ represents a methyl group or an ethyl group, and $R_4$ represents an alkyl group having 1 to 4 carbon atoms.)

The glycoluril derivative represented by Formula (1A) is obtained by reacting a glycoluril derivative represented by the following Formula (2A) with at least one compound represented by Formula (63).

The nitrogen-containing compound having 2 to 6 substituents represented by Formula (62) in the molecule is, for example, a glycoluril derivative represented by the following Formula (2A).

[Chem. 29]

(2A)

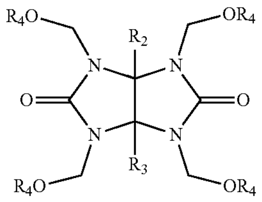

(In Formula (2A), $R^2$ and $R^3$ each independently represent a hydrogen atom, an alkyl group having 1 to 4 carbon atoms, or a phenyl group, and $R_4$'s each independently represent an alkyl group having 1 to 4 carbon atoms.)

Examples of the glycoluril derivative represented by Formula (2A) include compounds represented by the following Formula (2A-1) to Formula (2A-4). Further, examples of the compound represented by Formula (63) include compounds represented by the following Formula (2A-5) and Formula (2A-6).

[Chem. 30]

(2A-1)

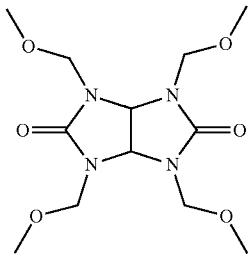

-continued (2A-2)

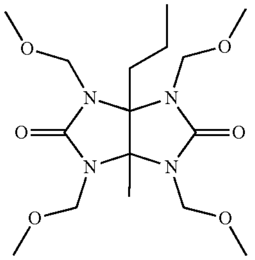

(2A-3)

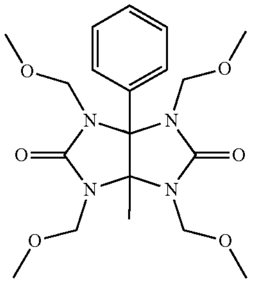

(2A-4)

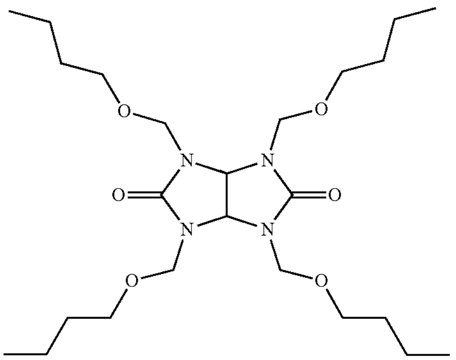

[Chem. 31]

(2A-5)

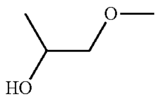

(2A-6)

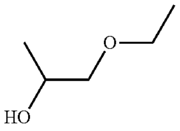

With regard to the nitrogen-containing compound having 2 to 6 substituents bonded to a nitrogen atom and represented by Formula (61) in the molecule, the entire disclosure of WO 2017/187969 A is incorporated in the present application by reference.

In a case where the crosslinking agent is used, a content ratio of the crosslinking agent is, for example, within the range of 1% by mass to 50% by mass, and preferably, 5% by mass to 30% by mass, relative to the organic resin.

<Method for Manufacturing Wafer for Manufacturing Semiconductor>

A method for manufacturing a wafer for manufacturing a semiconductor, which has a surface from which impurities have been removed, of the present application comprises the steps of: (A) heating a bare wafer (I) for manufacturing a semiconductor to 100° C. to 500° C. and/or cleaning a bare wafer (I) for manufacturing a semiconductor with ultrapure water; (B) inspecting a wafer (II) for manufacturing a semiconductor subjected to step (A) by the method for detecting impurities; and (C) selecting a wafer (IV) for manufacturing a semiconductor in which defects present on a surface thereof have been reduced by 80% or more in number compared to the bare wafer for manufacturing a semiconductor out of wafers (III) for manufacturing a semiconductor subjected to step (B).

The bare wafer (I) for manufacturing a semiconductor refers to an untreated wafer for manufacturing a semiconductor before performing the step of heating the wafer for manufacturing a semiconductor and/or cleaning the wafer for manufacturing a semiconductor with ultrapure water.

In step (A), the step of heating the wafer is performed within the range of 100° C. to 500° C., and is preferably performed at 120° C. to 500° C., 120° C. to 400° C., 150 to 400° C., 200 to 400° C., 200° C. to 500° C., or 300° C. to 500° C. A heating time is usually within the range of 0.5 minutes to 30 minutes. The heating is usually performed in the atmosphere, but may be performed in an inert gas such as a nitrogen atmosphere. The method for cleaning the wafer with ultrapure water is not particularly limited, and examples thereof include batch cleaning and sheet cleaning. A temperature of the ultrapure water is, for example, within the range of 5° C. to 50° C., and a cleaning time is, for example, within the range of 1 minute to 1 hour. The cleaning may be performed in combination with ultrasonic cleaning. The heating step and the ultrapure water cleaning step may be performed in combination. Either one may precede.

<Method for Selecting Wafer for Manufacturing Semiconductor>

A method for selecting a wafer for manufacturing a semiconductor of the present application comprises the steps of: (A) heating a bare wafer (I) for manufacturing a semiconductor to 100° C. to 500° C. and/or cleaning a bare wafer (I) for manufacturing a semiconductor with ultrapure water; (B) inspecting a wafer (II) for manufacturing a semiconductor subjected to step (A) by the method for detecting impurities; and (C) selecting a wafer (IV) for manufacturing a semiconductor in which defects present on a surface thereof have been reduced by 80% or more in number compared to the bare wafer (I) for manufacturing a semiconductor out of wafers (III) for manufacturing a semiconductor subjected to step (B).

Step (C) may include, for example, dividing the wafers (III) for manufacturing a semiconductor subjected to step (B) into a wafer (IV) for manufacturing a semiconductor in which defects present on a surface thereof has been reduced by 80% or more in number compared to the bare wafer (I) for manufacturing a semiconductor, and a wafer (V) for manufacturing a semiconductor in which defects present on a surface thereof has been reduced by less than 80% in number compared to the bare wafer (I) for manufacturing a semiconductor, and selecting the wafer (IV) for manufacturing a semiconductor.

The description of the terms according to the present item is in accordance with the description of <Method for Manufacturing Wafer for Manufacturing Semiconductor>.

EXAMPLES

Next, the present invention will be described in more detail with reference to Examples, but the present invention is not limited thereto.

Synthesis Example 1

Into a 300 mL four-necked flask, N,N'-diphenyl-1,4-phenylenediamine (41.98 g, 0.161 mol, manufactured by Tokyo Chemical Industry Co., Ltd.), 4-amyloxybenzaldehyde (31.02 g, 0.161 mol, manufactured by Tokyo Chemical Industry Co., Ltd.), 4-(tert-butoxy)styrene (94.75 g, 0.537 mol, manufactured by Wako Pure Chemical Industries, Ltd.), and propylene glycol monomethyl ether (172.37 g, manufactured by Kanto Chemical Co., Inc.) were charged. Methanesulfonic acid (4.65 g, 0.048 mol, manufactured by Tokyo Chemical Industry Co., Ltd.) was added thereto. While stirring the resultant mixture, the temperature thereof was raised to 135° C. for dissolution, to initiate the polymerization. After 18 hours, the mixture was cooled to room temperature. Then, reprecipitation was performed using a mixed solvent of methanol (1,000 g, manufactured by Kanto Chemical Co., Inc.), 1,000 g of ultrapure water, and 30% ammonia water (100 g, manufactured by Kanto Chemical Co., Inc.). The obtained precipitate was filtered and then dried with a vacuum dryer at 80° C. for 24 hours to obtain 136.68 g of a desired polymer represented by Formula (a). The weight average molecular weight Mw was 1,400 when measured in terms of polystyrene, and the polydispersity Mw/Mn was 1.29.

[Chem. 32]

Formula (a)

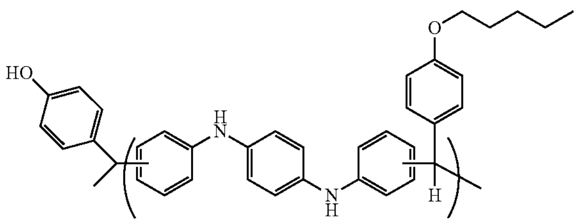

Synthesis Example 2

40.0 g of a compound of Formula (b-1) (manufactured by Daicel Corporation, trade name: EHPE3150), 20.3 g of 9-anthracenecarboxyic acid, and 13.7 g of benzoic acid were dissolved in 302.0 g of propylene glycol monomethyl ether. Thereafter, 1.5 g of benzyltriethylammonium was added thereto. Then, the resultant mixture was refluxed and reacted for 24 hours. The solution after the reaction was purified using an ion exchange method to obtain a polymer solution of Formula (b-2). GPC analysis showed that the obtained polymer had a weight average molecular weight of 4,100 in terms of standard polystyrene.

[Chem. 33]

Formula (b-1)

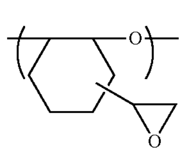

[Chem. 34]

Formula (b-2)

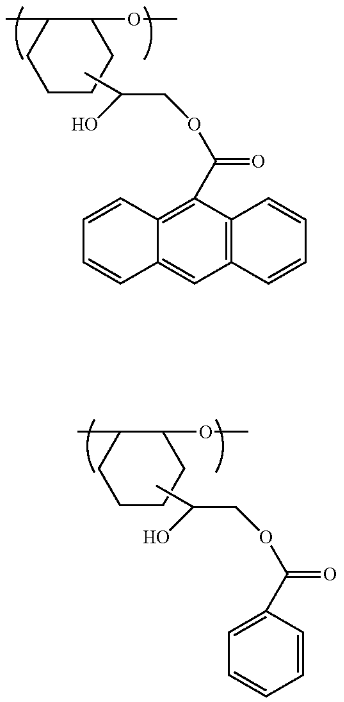

Synthesis Example 3

800 g of monoallyl diglycidyl isocyanurate (manufactured by Shikoku Chemicals Corporation), 608 g of 3,3'-dithiodipropionic acid (manufactured by Sakai Chemical Industry Co., Ltd., trade name: DTDPA), and 53 g of triphenyl monoethyl phosphonium bromide, which was a quaternary phosphonium salt, as a catalyst were dissolved in 2,191 g of propylene glycol monomethyl ether. The resultant mixture was heated, and while keeping at 120° C., the mixture was stirred in a nitrogen atmosphere for 4 hours. GPC analysis with a varnish solution of the obtained reaction product diluted with 3,652 g of propylene glycol monomethyl ether showed that the product had a weight average molecular weight of about 7,800 in terms of standard polystyrene. The reaction product contains a polymer compound having a structural unit represented by the following Formula (c-1).

[Chem. 35]

Formula (c-1)

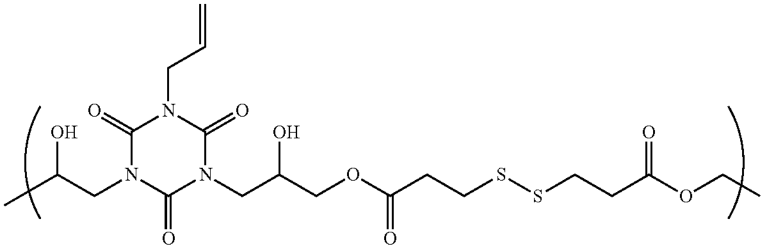

Preparation Example 1

To 17.64 g of the polymer synthesized in Synthesis Example 1 were added 3.53 g of a polymer represented by Formula (d-2) abbreviated as PGME-BIP-A, as a crosslinking agent, which was a compound obtained by dehydration condensation of each of four methylol groups of 2,2-bis[3,5-bis[(2-methoxy-1-methylethoxy)methyl]-4-hydroxyphenyl]propane represented by Formula (d-1) with propylene glycol monomethyl ether, 0.58 g of pyridinium-p-phenolsulfonate as a crosslinking catalyst, 0.02 g of MEGA FACE [trade name] R-30N manufactured by DIC Corporation as a surfactant, and 23.47 g of propylene glycol monomethyl ether and 54.76 g of propylene glycol monomethyl ether acetate as solvents, thereby preparing a resist underlayer film-forming composition.

[Chem. 36]

Formula (d-1)

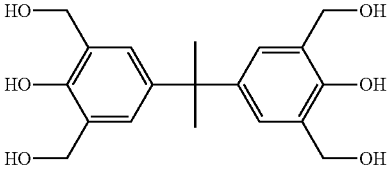

[Chem. 37]

Formula (d-2)

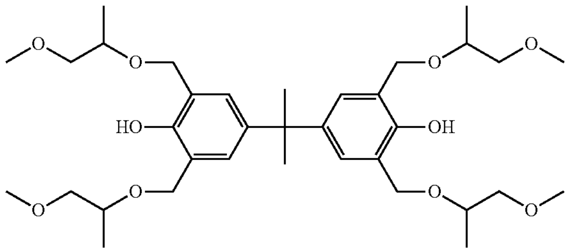

Preparation Example 2

To 31.49 g the polymer solution (solid content in the polymer of 16% by mass) obtained in Synthesis Example 2 were added 1.26 g of tetramethoxymethyl glycoluril (POWDERLINK (registered trademark) 1174) manufactured by Nihon Cytec Industries Inc. as a crosslinking agent, 0.04 g of pyridinium-p-toluenesulfonate as a crosslinking catalyst, 0.004 g of MEGA FACE [trade name] R-30N manufactured by DIC Corporation as a surfactant, and 57.63 g of propylene glycol monomethyl ether and 9.58 g of propylene glycol monomethyl ether acetate as solvents, thereby preparing a resist underlayer film-forming composition.

Preparation Example 3

To 3.58 g the polymer solution (solid content in the polymer of 20% by mass) obtained in Synthesis Example 2 were added 0.18 g of tetramethoxymethyl glycoluril (POWDERLINK (registered trademark) 1174) manufactured by Nihon Cytec Industries Inc., 0.02 g of 4-hydroxybenzenesulfonic acid (PSA) as a crosslinking catalyst, 0.01 g of bisphenol S as an additive, 0.01 g of MEGA FACE [trade name] R-30N manufactured by DIC Corporation as a surfactant, 86.30 g of propylene glycol monomethyl ether, and 9.91 g of propylene glycol monomethyl ether acetate were added, thereby preparing a resist underlayer film-forming composition.

Example 1

The resist underlayer film-forming composition obtained in Preparation Example 1 was coated onto a 12-inch silicon wafer using a coater track CLEAN TRACK Lithius Pro AP manufactured by Tokyo Electron Limited. The coated film was baked at 240° C. for 60 seconds and then baked at 400° C. for 60 seconds to obtain a 12-inch silicon wafer having a coating film of 800 nm thickness formed thereon.

Example 2

The resist underlayer film-forming composition obtained in Preparation Example 2 was coated onto a 12-inch silicon wafer using a coater track CLEAN TRACK Lithius Pro AP manufactured by Tokyo Electron Limited. The coated film was baked at 205° C. for 60 seconds to obtain a 12-inch silicon wafer having a coating film of 200 nm thickness formed thereon.

Reference Example 1

A 12-inch silicon wafer was baked at 400° C. for 60 seconds using a coater track CLEAN TRACK Lithius Pro AP manufactured by Tokyo Electron Limited to obtain a 12-inch silicon wafer subjected to a heat treatment.

Reference Example 2

Propylene glycol monomethyl ether (PGME) as a solvent used in the resist underlayer film-forming composition was coated onto a 12-inch silicon wafer using a coater track CLEAN TRACK Lithius Pro AP manufactured by Tokyo Electron Limited. The coated film was baked at 205° C. for 60 seconds to obtain a 12-inch silicon wafer having a coating film formed thereon.

Reference Example 3

A 12-inch silicon wafer was baked at 400° C. for 60 seconds using a coating coater track CLEAN TRACK Lithius Pro AP manufactured by Tokyo Electron Limited. The resist underlayer film-forming composition obtained in Preparation Example 1 was coated onto the baked 12-inch silicon wafer. The coated film was baked at 240° C. for 60 seconds and then baked at 400° C. for 60 seconds to obtain a 12-inch silicon wafer having a coating film of 800 nm thickness formed thereon.

Reference Example 4

A 12-inch silicon wafer was baked at 205° C. for 60 seconds using a coating coater track CLEAN TRACK Lithius Pro AP manufactured by Tokyo Electron Limited. The resist underlayer film-forming composition obtained in Preparation Example 2 was coated onto the baked 12-inch silicon wafer. The coated film was baked at 25° C. for 60 seconds to obtain a 12-inch silicon wafer having a coating film of 200 nm thickness formed thereon.

Reference Example 5

The resist underlayer film-forming composition obtained in Preparation Example 3 was coated onto a 12-inch silicon wafer using a coater track CLEAN TRACK Lithius Pro AP manufactured by Tokyo Electron Limited. The coated film was baked at 205° C. for 60 seconds to obtain a 12-inch silicon wafer having a coating film of 25 nm thickness formed thereon.

(Defect Distribution on Wafer)

Figure 2:
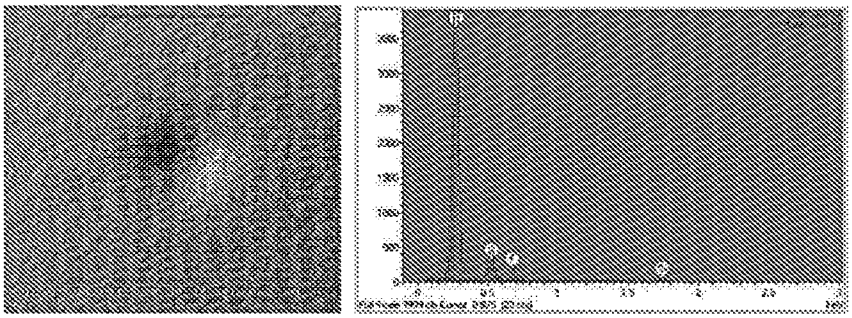
FIG. 2 is an SEM photograph showing a defect shape of Example 1 and a graph showing a result of composition analysis.
Figure 3:
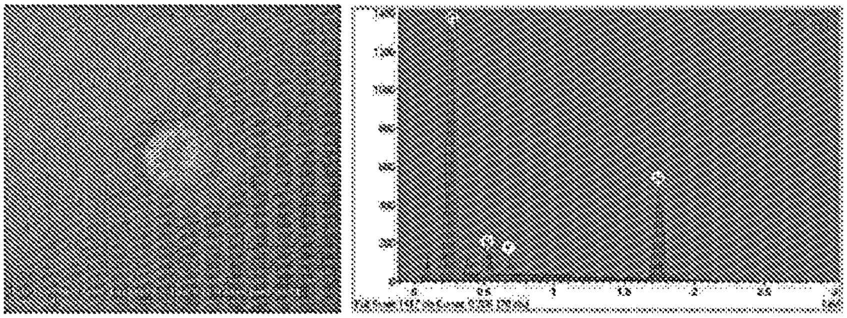
FIG. 3 is an SEM photograph showing a defect shape of Example 2 and a graph showing a result of composition analysis.

The silicon wafers obtained in Examples 1 and 2 were measured for defects on the film surface thereof with a wafer inspection system Surfscan SP2XP manufactured by KLA-Tencor Corporation. The defect distribution in the wafers is illustrated in FIG. 1, and the number of defects is shown in Table 1. In addition, FIGS. 2 and 3 illustrate the shape and the results of performing elemental analysis of the defects detected in Examples 1 and 2 with a defect review SEM RS6000 manufactured by Hitachi High-Technologies Corporation.

TABLE 1

Number of defects on wafer

| | Applied chemical | Defect size | Number of defects |
|---|---|---|---|
| Example 1 | Preparation Example 1 | 70 nm or more | 61 |
| Example 2 | Preparation Example 2 | 70 nm or more | 304 |
| Reference Example 1 | None | 70 nm or more | 3 |
| Reference Example 2 | PGME | 70 nm or more | 5 |
| Reference Example 3 | Preparation Example 1 | 70 nm or more | 4 |
| Reference Example 4 | Preparation Example 2 | 70 nm or more | 2 |
| Reference Example 5 | Preparation Example 3 | 70 nm or more | 0 |

In FIG. 1, a characteristic distribution of defects on the outer periphery of the wafer was seen in Examples 1 and 2, in which the resist underlayer film-forming composition was coated onto an untreated 12-inch silicon wafer.

No characteristic distribution of defects was observed on the outer periphery of the wafer and the number of defects was small in Reference Examples 3 and 4, in which the resist underlayer film-forming composition was coated onto a 12-inch silicon wafer baked in advance. In addition, no characteristic distribution of defects was observed on the outer periphery of the wafer also in Reference Example 1, in which a 12-inch silicon wafer was baked, and in Reference Example 2, in which a solvent was coated, This showed that impurities were present on the surface of the 12-inch silicon wafers, that the impurities were removable components by a baking treatment, and that the impurities could not be detected by baking the 12-inch silicon wafer as it was or by coating a solvent that would volatilize and not remain on the wafer by the baking. On the other hand, from Reference Example 5, it was shown that the impurities could not be detected in the coating film having a thickness of 25 nm, and the thickness of the coating film should be 25 nm or more.

From FIG. 2, it was confirmed that the shapes of the defects detected on the outer periphery of the wafer of Example 1 were all similar to each other, and that fluorine element was characteristically detected.

In addition, from FIG. 3, it was confirmed that the shapes of the defects detected on the outer periphery of the wafer of Example 2 were all similar to each other, and that fluorine element was characteristically detected. Therefore, it was demonstrated that fluorine was contained in the impurities. It was demonstrated that detection of the fluorine-containing impurities present on the 12-inch silicon wafer would become possible by treating each of Examples 1 and 2 so as to confine the fluorine-containing impurities on the organic film formed on the wafer by using the resist underlayer film-forming composition.

Example 3

A 12-inch silicon wafer was baked at 205° C. for 60 seconds using a coater track CLEAN TRACK Lithius Pro AP manufactured by Tokyo Electron Limited. The resist underlayer film-forming composition obtained in Preparation Example 2 was coated onto the baked wafer using a coater track CLEAN TRACK Lithius Pro AP manufactured by Tokyo Electron Limited. The coated film was baked at 205° C. in the atmosphere for 60 seconds to obtain a 12-inch silicon wafer having a coating film of 200 nm thickness formed thereon.

Example 4

While a 12-inch silicon wafer was rotated, ultrapure water at 23° C. was discharged onto a surface of the wafer at 1.5 L/min for 60 seconds using a spin cleaner MSC-5000NC manufactured by MIMASU SEMICONDUCTOR IND. CO., LTD. to clean the surface of the wafer. The resist underlayer film-forming composition obtained in Preparation Example 2 was coated to the cleaned wafer using a coater track CLEAN TRACK Lithius Pro AP manufactured by Tokyo Electron Limited. The coated film was baked at 205° C. in the atmosphere for 60 seconds to obtain a 12-inch silicon wafer having a coating film of 200 nm thickness formed thereon.

Example 5

A 12-inch silicon wafer was baked at 400° C. for 60 seconds using a coater track CLEAN TRACK Lithius Pro AP manufactured by Tokyo Electron Limited. The resist underlayer film-forming composition obtained in Preparation Example 1 was coated onto the baked wafer using a coater track CLEAN TRACK Lithius Pro AP manufactured by Tokyo Electron Limited. The coated film was baked at 240° C. in the atmosphere for 60 seconds and then baked at 400° C. in the atmosphere for 60 seconds to obtain a 12-inch silicon wafer having a coating film of 800 nm thickness formed thereon.

Comparative Example 1

The resist underlayer film-forming composition obtained in Preparation Example 2 was coated onto a 12-inch silicon wafer using a coater track CLEAN TRACK Lithius Pro AP manufactured by Tokyo Electron Limited. The coated film was baked at 205° C. in the atmosphere for 60 seconds to obtain a 12-inch silicon wafer having a coating film of 200 nm thickness formed thereon.

Comparative Example 2

The resist underlayer film-forming composition obtained in Preparation Example 1 was coated onto a 12-inch silicon wafer using a coater track CLEAN TRACK Lithius Pro AP manufactured by Tokyo Electron Limited. The coated film was baked at 240° C. in the atmosphere for 60 seconds and then baked at 400° C. in the atmosphere for 60 seconds to obtain a 12-inch silicon wafer having a coating film of 800 nm thickness formed thereon.

(Defect Occurrence Distribution on Wafer)

Defects on the film surfaces of the silicon wafers obtained in Examples 3 to 5 were measured with a wafer inspection system Surfscan SP2XP manufactured by KLA-Tencor Corporation. The defect distribution in the wafers is illustrated in FIG. 4, and the number of defects is shown in Table 2.

TABLE 2

| Number of defects on wafer | | | |
|---|---|---|---|
| | Applied chemical | Defect size | Number of defects |
| Example 3 | Preparation Example 2 | 70 nm or more | 2 |
| Example 4 | Preparation Example 2 | 70 nm or more | 47 |
| Example 5 | Preparation Example 1 | 70 nm or more | 4 |
| Comparative Example 1 | Preparation Example 2 | 70 nm or more | 305 |
| Comparative Example 2 | Preparation Example 1 | 70 nm or more | 61 |

Figure 4:
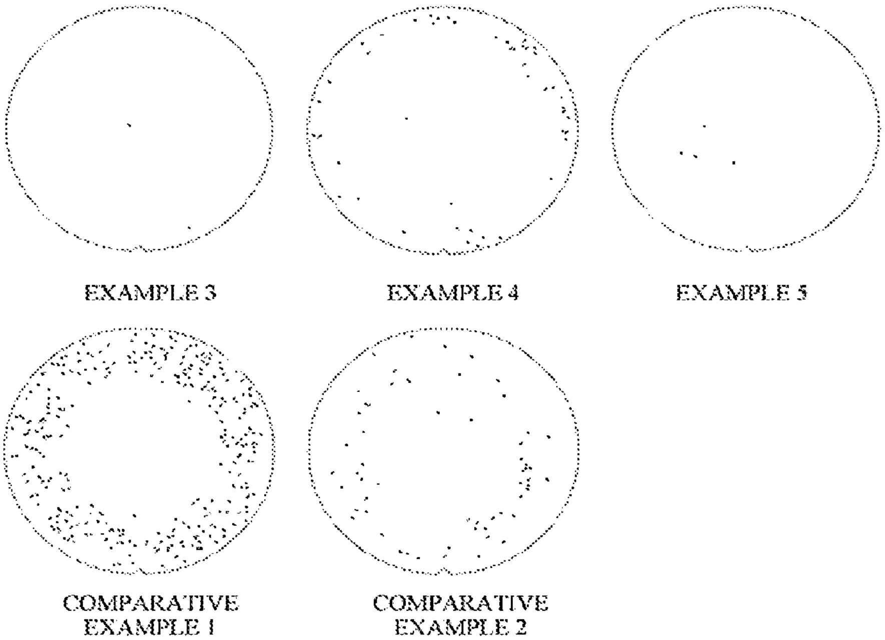
FIG. 4 is a schematic view of a defect distribution in a silicon wafer obtained in each of Examples 3 to 5 and Comparative Examples 1 and 2.

From FIG. 4 and Table 2, a characteristic distribution of defects on the outer periphery of the wafer such as seen in Comparative Examples 1 and 2 was not observed in Examples 3 to 5, in which the resist underlayer film-forming composition was coated onto the 12-inch silicon wafer subjected to the ultrapure water cleaning and baking treatment, and the number of defects of 70 nm or less in Examples 3 to 5 was ⅕ that in Comparative Examples 1 and 2. This showed that impurities were present on the surface of the 12-inch silicon wafer, and that the impurities were components removable by performing an ultrapure water cleaning or baking treatment. From this, it is shown that it is possible to form a coating film without being affected by impurities on the surface of the wafer by performing ultrapure water cleaning and baking treatments before coating a resist underlayer film onto the wafer.

INDUSTRIAL APPLICABILITY

According to the method of the present application, it is possible to detect the presence of impurities that are present on the surface of the wafer for manufacturing a semiconductor and would be removed by a heating and/or ultrapure water cleaning treatment. The impurities may contain fluorine atom. It is possible to provide methods for manufacturing and selecting a wafer for manufacturing a semiconductor (the so-called bare wafer) from which have been removed such impurities as could not be detected without using the detection method.

The invention claimed is:

1. A method for detecting fluorine atom-containing impurities on a surface of a wafer for manufacturing a semiconductor, comprising the steps of:

coating a film-forming composition to a surface of the wafer and baking the film-forming composition to form a film having a thickness of 200 to 800 nm so as to confine the fluorine atom-containing impurities on the film formed on the wafer; and after the step of coating, detecting the confined fluorine atom-containing impurities using a wafer inspection tool.

2. The method for detecting impurities according to claim 1, wherein the film-forming composition contains a resin.

3. The method for detecting impurities according to claim 1, wherein the film-forming composition is a composition for forming a coating film for lithography.

4. The method for detecting impurities according to claim 1, wherein the film-forming composition is a resist underlayer film-forming composition.

5. A method for manufacturing a wafer for manufacturing a semiconductor, which has a surface from which fluorine atom-containing impurities have been removed, comprising the steps of:

(A) heating a bare wafer to 100° C. to 500° C. and/or cleaning a bare wafer with ultrapure water;

(B) following step (A), inspecting the wafer after the wafer has been subjected to the method for detecting fluorine atom-containing impurities according to claim 1; and (C) from among the wafers subjected to step (B), selecting a wafer for manufacturing the semiconductor in which defects present on a surface of the wafer have been reduced by 80% or more in number compared to the bare wafer.

6. A method for selecting a wafer for manufacturing a semiconductor, comprising the steps of:

(A) heating a bare wafer to 100° C. to 500° C. and/or cleaning a bare wafer with ultrapure water;

(B) following step (A), inspecting the wafer after the wafer has been subjected to the method for detecting fluorine atom-containing impurities according to claim 1; and (C) from among the wafers subjected to step (B), selecting a wafer for manufacturing the semiconductor in which defects present on a surface of the wafer have been reduced by 80% or more in number compared to the bare wafer, wherein step (C) includes separating the wafers subjected to step (B) into wafer(s) (IV) for manufacturing the semiconductor in which defects present on a surface of the wafer have been reduced by 80% or more in number compared to the bare wafer, and other wafer(s) (V) in which defects present on a surface of the wafer have been reduced by less than 80% in number compared to the bare wafer, and selecting the wafer(s) (IV) for manufacturing the semiconductor.

* * * * *